United States Patent [19]

Echols et al.

[11] Patent Number: 4,839,613

[45] Date of Patent: Jun. 13, 1989

[54] TEMPERATURE COMPENSATION FOR A DISCIPLINED FREQUENCY STANDARD

[75] Inventors: James D. Echols, Hutto, Tex.; James A. Barnes, Bolder, Colo.; Bruce M. Penrod, Weir, Tex.

[73] Assignee: Austron, Inc., Austin, Tex.

[21] Appl. No.: 200,637

[22] Filed: May 31, 1988

[51] Int. Cl.$^4$ .............................................. H03B 1/00
[52] U.S. Cl. ........................................ 331/69; 331/25; 331/176
[58] Field of Search ................... 331/3, 18, 25, 66, 69, 331/176

[56] References Cited

U.S. PATENT DOCUMENTS

| | | | |
|---|---|---|---|
| 3,382,452 | 5/1968 | Rempel et al. | 331/3 |
| 4,162,379 | 7/1979 | Sebens et al. | 219/497 |
| 4,297,657 | 10/1981 | Frerking | 331/176 |
| 4,479,096 | 10/1984 | Fowks | 331/3 |
| 4,523,084 | 6/1985 | Tamura et al. | 219/497 |
| 4,546,238 | 10/1985 | Ahs | 219/497 |

OTHER PUBLICATIONS

Bourke and Penrod, "An Analysis of a Microprocessor Controlled Disciplined Frequency Standard", Proc. 1983, 37th Annual Symp. on Frequency Control, p. 485.
Allan et al., "An Ultra-Precise Time Synchronization System Designed by Computer Simulation", *Frequency*, Jan. 1968.

Primary Examiner—Eugene R. LaRoche
Assistant Examiner—Robert J. Pascal
Attorney, Agent, or Firm—Dennis T. Griggs

[57] ABSTRACT

A disciplined frequency standard includes an adaptive control loop to correct for ambient temperature effects. The crystal resonator of the disciplined frequency standard is enclosed within an oven which is heated by current applied through a resistive heater. A small current sensing resistor is inserted in series between the oven current source and the oven heater to produce a voltage drop which is proportional to oven current. An analog temperature signal T is derived from the voltage drop and is multiplied with a frequency/temperature parameter dF/dT to produce a compound temperature correction factor UT. The frequency/temperature parameter U and an aging drift parameter B are measured in control loops which are weighted by averaging time parameters K, L, respectively. The measured values of B, U are stored and the weighting factors K, L are adjusted according to the variance of the most recent measurement from the stored average. The adjusted values of the correction parameters follow closely and converge to the actual parameters values over a period of time.

9 Claims, 3 Drawing Sheets

TEMPERATURE COMPENSATION FOR A DISCIPLINED FREQUENCY STANDARD

FIELD OF THE INVENTION

This invention relates generally to improvements in secondary frequency standards, and in particular to method and apparatus for stabilizing a voltage controlled crystal oscillator for free-running operation independent of a primary reference clock.

BACKGROUND OF THE INVENTION

The fundamental standard of time in the United States is provided by a cesium beam resonator whose accuracy is of the order of one part in $10^{13}$. By radio broadcasting signals related to the frequency of the cesium beam standard, the National Bureau of Standard makes the frequency and time standards available to organizations equipped to receive the signals. Atomic clock accuracy is needed for various systems such as telecommunications, electronic navigation systems, and scientific measurements. Such organizations utilize a secondary clock which can be synchronized with the national standard. Such secondary clocks are operated independently and are physically remote from the national standard. Synchronization is typically made daily by radio and occasionally by the use of portable cesium beam clocks which are transported to the secondary clock locations.

An instrument widely used as a secondary clock is the electronic counter-timer which uses a piezoelectric crystal oscillator. The crystal oscillator frequency is very stable since the crystal is kept in a temperature-controlled oven. A typical operating frequency is $10^7$ Hz while the drift in frequency may be of the order of 7 parts in $10^{10}$ per week. This gradual drift can, over a period of time, cause significant errors; thus, highly accurate measurements require periodic recalibration of the local oscillator against a suitable primary standard such as the National Bureau of Standards radio broadcast signal.

Generally, crystal oscillators are subject to three types of frequency instabilities, a linear change in frequency with time known as aging drift, a non-linear change in frequency with ambient temperature known as thermal drift and a random frequency fluctuation including flicker noise. These instabilities will cause the secondary clock to lose synchronization with the master clock. Aging drift and ambient thermal drift are predictable and therefore removable, but flicker noise is unpredictable and therefore not removable. Accordingly, periodic synchronization with a primary standard cannot be avoided. There is a continuing interest in improving the stability of the freerunning operation of the resonator during the intervals between calibrations.

DESCRIPTION OF THE PRIOR ART

The long term behavior of a high quality quartz crystal resonator which is referenced to a primary frequency standard is well known. After initial turn on transients have subsided, the quartz crystal resonates according to the following formula (ignoring flicker noise and ambient temperature effects):

$$F = (1+A)F_o + BF_o t$$

where:

F = frequency of the resonator
$F_o$ = frequency of the primary reference
A = fractional frequency difference between resonator and reference at turn-on (a constant)
B = a constant proportional to fractional frequency drift (aging)
t = elapsed time A disciplined frequency standard (DFS) contains an internal oscillator whose frequency is forced to agree with a master reference clock. Upon loss of the master reference clock, the disciplined frequency standard forces its internal oscillator to continue to agree with the outside reference by correcting for the fractional frequency difference A. However, in the "free-running" mode, that is when the reference is no longer available, the local frequency F will diverge from the reference frequency $F_o$ by a factor proportional to the elapsed time product of the aging drift parameter B. Upon loss of the reference frequency $F_o$, a frequency error will accumulate due to aging of the internal crystal oscillator at a rate determined by the magnitude of the aging parameter B. Many disciplined frequency standards correct for the drift parameter B.

Moreover, the frequency response of a quartz resonator is a complex function of temperature. To minimize the effects of temperature, most high quality oscillators house the quartz crystal resonator, and sometimes the associated circuitry, in a proportional oven designed to hold the operating temperature of the crystal at a constant level higher than ambient temperature. A well designed oven will hold the operating temperature of the resonator to within a few millidegrees. However, even with the best practical oven design, some residual effects of ambient temperature changes can be seen in the frequency of the resonator. That is, variations in resonator temperature are induced by thermal heat transfer through the oven walls to the surrounding environment. Variations in construction of resonators will cause the temperature response of oscillators to vary widely.

While ambient thermally induced frequency changes are bounded, they perturb the free-running frequency of the disciplined frequency standard in the absence of the reference signal $F_o$ and contaminate the measurement and determination of the aging parameter B when the primary reference frequency is present, thus degrading the ability of the disciplined frequency standard to correct for aging when the primary reference frequency is absent.

SUMMARY OF THE INVENTION

Compensation for ambient thermally induced frequency variations is achieved by adding a compound correction factor UT to the characteristic equation for the frequency locked combination as follows:

$$F = (1+A)F_o + BF_o t + UT$$

The temperature/frequency response characteristic of a quartz crystal oscillator is non-linear over a wide temperature range. However, over the limited temperature range experienced by a crystal resonator in an oscillator oven, the frequency F of the oscillator as a function of oven temperature T can be closely approximated as:

$$dF/dT = U$$

where:

F = the frequency of the oscillator
T = the internal oven temperature
U = a constant That is, the incremental change of frequency with an incremental change in temperature (dF/dT) through the narrow range of temperature excursions experienced by the crystal resonator within the oven can be assumed to be a constant, U. The parameters U, T are measured during operation of the oscillator when locked to the reference frequency $F_o$ of a primary reference.

In the preferred embodiment, the current applied to the heater element within the oven is proportional to the temperature experienced by the resonator. The voltage deep across a small current sensing resistor inserted in series between the oven current source and the oven heater element is proportional to oven current. The voltage drop signal $V_R$ is scaled to produce an analog signal T which is proportional to the actual resonator temperature. The analog signal T is multiplied with the frequency/temperature parameter U to produce a compound temperature correction factor UT.

The parameters A, B and U are measured in a circuit in which the crystal resonator is referenced to a primary clock in frequency lock relation, with frictional frequency offset correction, long-term drift aging correction and temperature correction.

According to another aspect of the invention, the variable correction factors B, U are measured in control loops which are weighted by averaging time parameters K, L, respectively. The measured values B, U are stored and the weighting factors K, L are adjusted according to the variance of the most recent measurement from the stored average. The weighting factors K, L establish the averaging time of successive measurements, with the result that each control loop is independently adaptable. According to this weighting factor arrangement, the adjusted values of B, U follow closely and converge to the actual values of the variables B, U over a period of time.

In the absence of the primary reference, the correction factors A, Bt and UT are added together and input as a correction voltage to the voltage controlled resonator, thereby nulling the fractional frequency offset and removing long-term aging drift and ambient heat transfer induced frequency fluctuations. The disciplined frequency standard will thereafter provide a local reference frequency which agrees closely with the primary reference, even though the primary reference is no longer available.

Operational features and advantages of the present invention will be appreciated by those skilled in the art upon reading the detailed description which follows in connection with the attached drawings.

DETAILED DESCRIPTION OF THE PREFERRED EMBODIMENT

Figure 1:
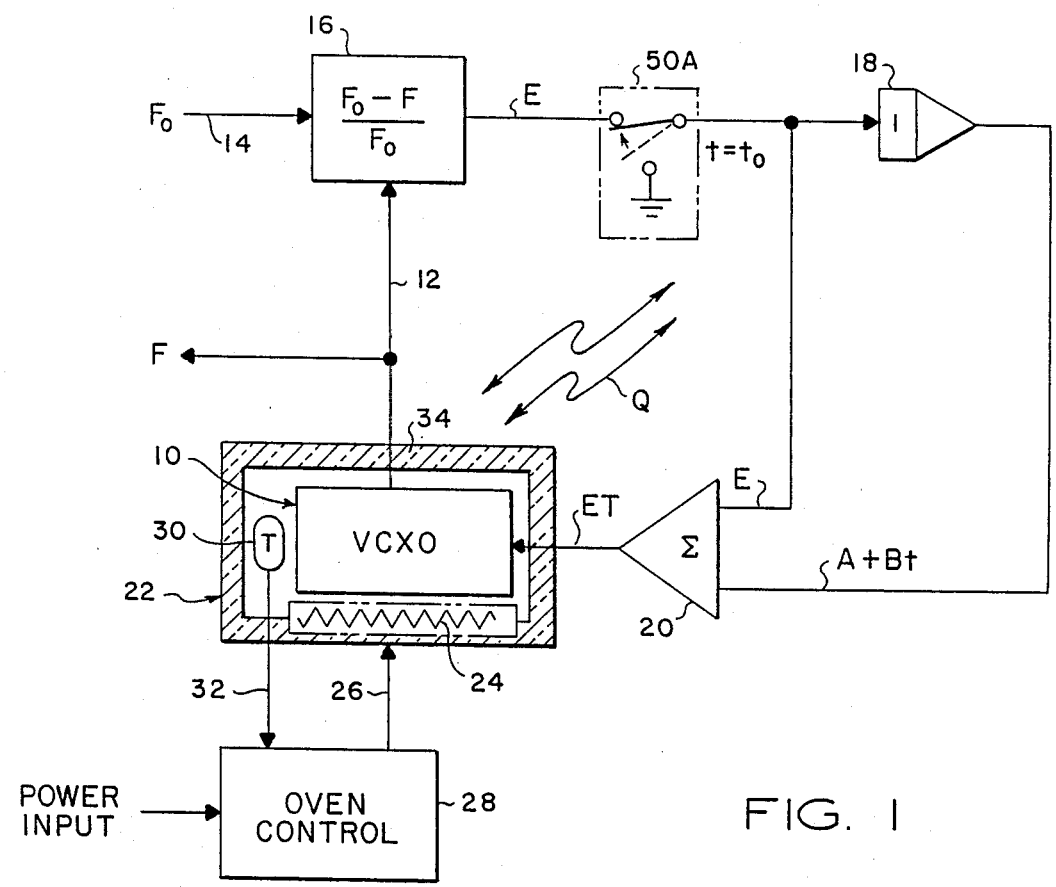
FIG. 1 is a simplified block diagram of a disciplined frequency standard having compensation for fractional frequency drift induced by crystal aging.

In the description which follows, like parts are indicated throughout the specification and drawings with the same reference numerals, respectively.

Referring now to FIG. 1 of the drawings, a crystal controlled oscillator 10 produces an output signal 12 having a frequency F which is to be stabilized with reference to the frequency $F_o$ of a primary standard, for example a cesium beam resonator. The resonator 10 is a voltage control crystal oscillator which is said to be disciplined to the frequency $F_o$ of the primary reference. This is accomplished by applying a constant correction voltage A which is representative of the magnitude of fractional frequency difference ($\epsilon$) between the resonator and the reference at turn-on ($t=t_o$). The correction voltage A is also applied to a unitary gain integrator 18. The output signal 12 of the disciplined frequency standard 10 and the output signal 14 of the primary standard are compared in a difference frequency detector 16 which produces a difference signal representative of the fractional frequency difference ($F_o-F$)/$F_o$ between the local resonator and the reference standard.

Figure 3:
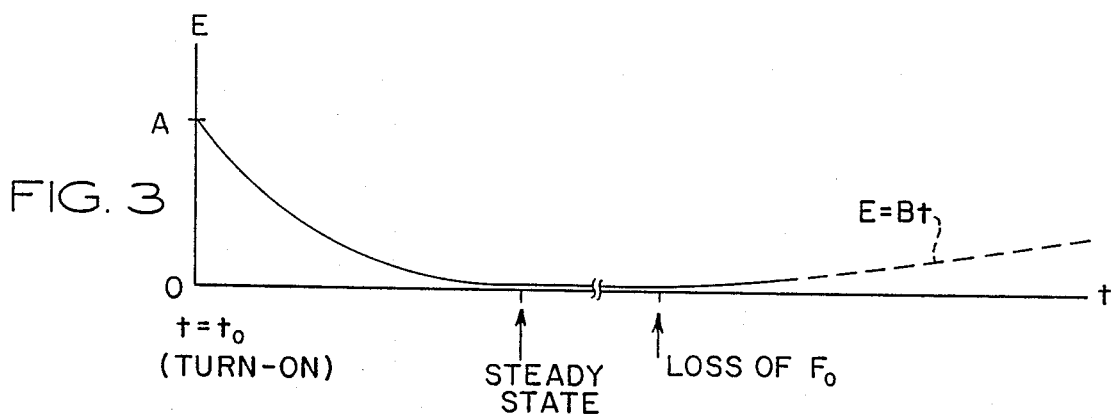
FIG. 3 is a graph of frequency difference ($\epsilon$) versus time (t) which illustrates turn-on, steady-state and coasting response.

Referring now to FIG. 3, at turn-on ($\epsilon$)=A, a constant. As turn-on transients subside, the output of integrator 18 will assume the value of A with the value of ($\epsilon$) approaching 0. The fractional frequency difference A is an easily measured parameter and requires only a single correction. In the "free-running" mode, i.e., when the primary reference signal 14 is disconnected or no longer available, switch 50A is set to ground, freezing the output of integrator 18 at A+. However, the local frequency F will diverge from the reference frequency $F_o$ as a linear time function Bt, where B referred to as the aging drift parameter. As indicated in FIG. 3, the aging drift error, if uncorrected, will accumulate and become unbounded with elapsed time t.

The performance of the disciplined frequency standard shown in FIG. 1 is improved by correcting for the aging drift parameter B. Because the aging characteristic of each quartz resonator is unique, it is necessary to measure the parameter B for each resonator.

Figure 2:
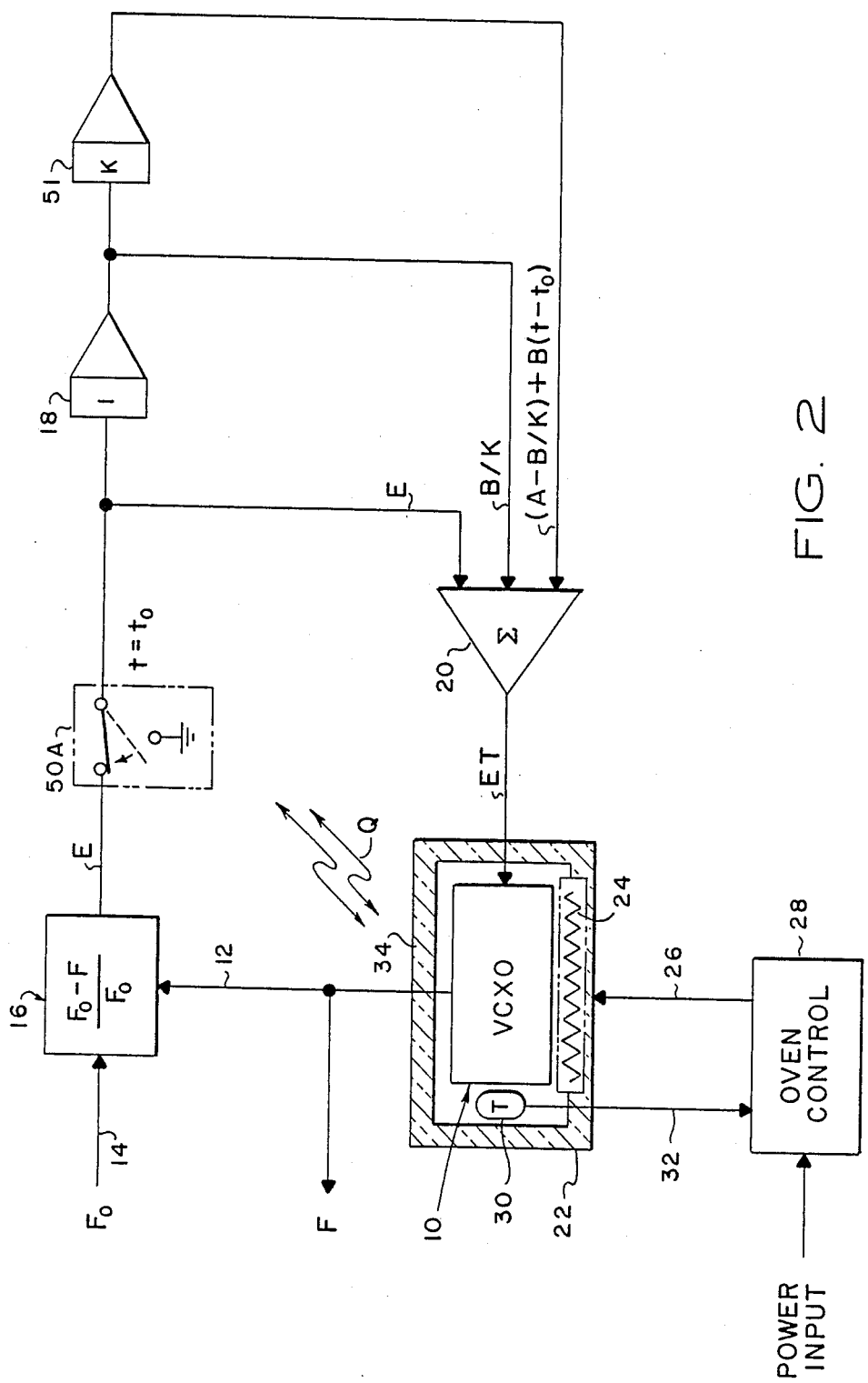
FIG. 2 is a simplified block diagram of a disciplined frequency standard having compensation for drift.

Referring now to FIG. 2, a second integrator 51 with variable gain K is added to the system. As before, at $t=t_o$, the output of the integrator 18 begins to climb toward A. However, that voltage is also applied to integrator 51 whose output begins to climb toward A and is added to summing amplifier 20. In the absence of drift, the system will stabilize with the output of integrator 51 at A, the output of integrator 18 at 0 and the error signal at 0.

Figure 4:
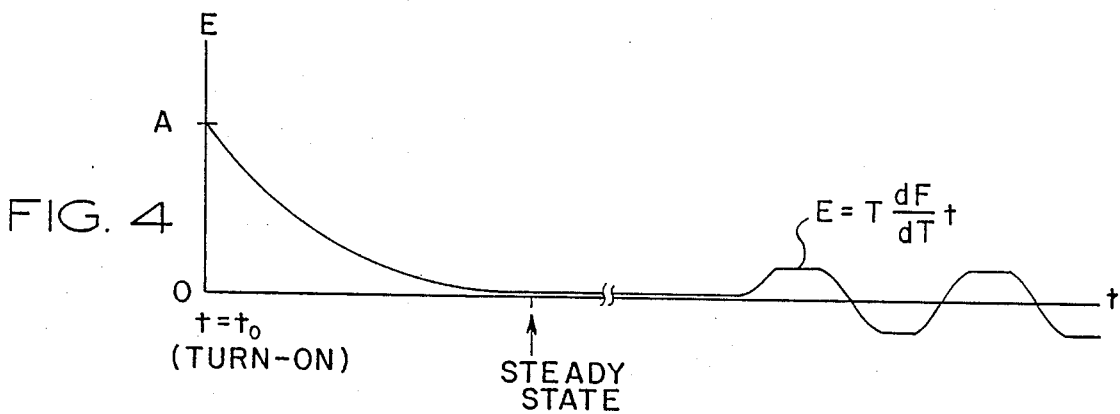
FIG. 4 is a graph of frequency difference ($\epsilon$) versus time (t) in which the effects of thermally induced frequency fluctuations is illustrated.

With drift present, the outputs will stabilize as shown in FIG. 4. The frequency of the local oscillator 10 is forced to that of the reference 14. The fractional frequency error is forced to 0. At this time, the output of the integrator 18 is stable and is equal to the drift coefficient B divided by the gain K of the integrator 51. The output of integrator 51 will be equal to the fractional frequency error at $t_o$, A minus that portion of the correction being applied by integrator 18, B/K plus a linearly changing voltage, B(t−t₀) arising from the presence from integrator 18 of an input of the drift related term, B/K.

When the primary reference signal 14 is disconnected or no longer available, switch 50A is set to ground, freezing the output of integrator 18 at B/K. The output of integrator 51 continues to change, adding a linearly changing voltage arising from the presence from integrator 18 of B/K. The measured values of A and B are thus combined and applied as electronic tuning signal ET to the voltage controlled oscillator 10.

The effects of ambient temperature variations are minimized by operating the resonator 10 within a temperature controlled oven 22. The internal temperature T within the oven 22 is elevated to a temperature above ambient by an electrical resistance heater element 24. Current is applied to the heater element 24 through a conductor 26 from an oven control 28. A thermistor sensor 30 senses the internal temperature T of the oven and provides a feedback signal 32 which is compared with a pre-set temperature level within the oven control 28. Oven current flow through conductor 26 is varied automatically as required to maintain T at or near the desired level.

It will be appreciated that the internal temperature T of the oven 22 increases and decreases in proportion to the transfer of heat energy Q through the wall 34 of the oven 20. The temperature excursions are compensated directly by the disciplined frequency standard in the frequency lock arrangement shown in FIG. 2. However, upon disconnection of the primary reference, frequency variations are induced within the resonator frequency F, as shown in FIG. 4, during frequency lock operation, as well as being present after the primary reference $F_o$ is disconnected.

For example, measurement of the internal oven temperature T conducted in a laboratory varied as the laboratory air conditioning was cycled. The measured internal oven temperature T approximated a square wave with a twenty-four hour period, corresponding generally with the duty cycle of the air conditioning unit. It will be appreciated that although the error generated by such ambient thermally induced frequency changes is bounded, the variations perturb the free-running frequency of the disciplined frequency standard in the absence of the primary reference signal $F_o$ and contaminate the measurement and determination of the aging drift parameter B when the primary reference is present.

Figure 5:
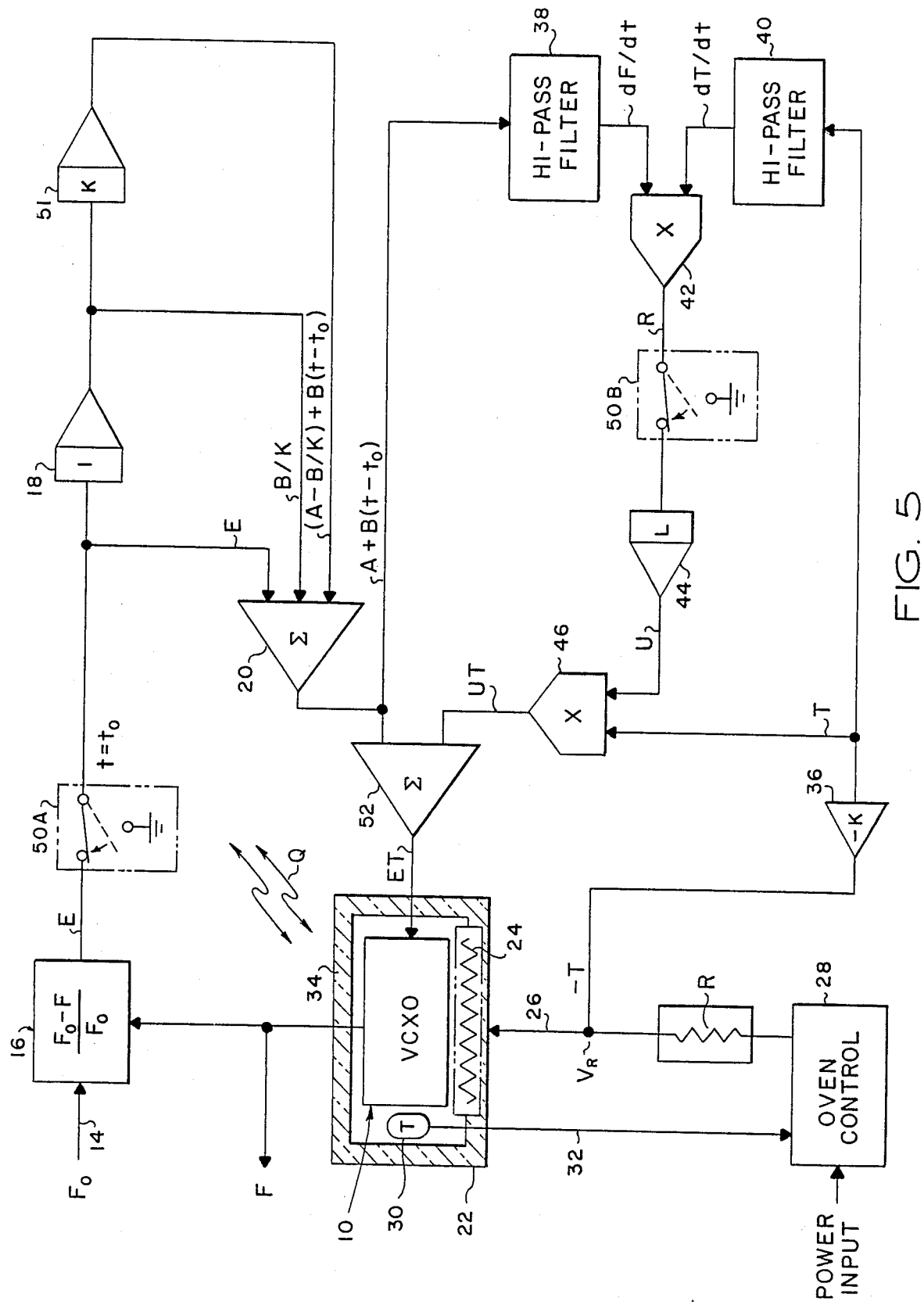
FIG. 5 is a simplified block diagram of a frequency locked, disciplined frequency standard in which the fractional frequency offset parameter A, the fractional drift parameter B and the resonator temperature parameters U, T are derived.

Compensation for thermally induced frequency variations is achieved according to one aspect of the present invention by adding a compound correction factor UT to the electronic tuning voltage ET, as illustrated in FIG. 5. The parameters U, T are measured during operation of the oscillator 10 when locked to the referenced frequency $F_o$ of the primary reference. The parameter T is derived by sensing the flow of current through a current sensing resistor R which is connected in series between the oven control 28 and the oven heater element 24. The voltage drop $V_R$ across sensing resistor R is scaled by a constant-(k) in a scaling amplifier 36 to produce an analog signal T which is proportional to the actual resonator temperature as sensed by the thermistor 30. The analog signal T is multiplied with the frequency/temperature parameter U to produce the compound temperature correction factor UT.

The frequency/temperature parameter U is a constant which has been previously defined as dF/dT. The frequency lock electrical tuning voltage, A + Bt, is input to a high pass filter 38 which yields an approximation of the time differential of F, dF/dt. The analog signal T is likewise applied to the input of a high pass filter 40, which yields the approximate time derivative of T, dT/dt.

The time derivatives of T and F are correlated in multiplier 42. The multiplied, zero-mean signals produce a nonzero dc input R to integrator 44 that is proportional to how well they are correlated. As the output of integrator 44 begins to move away from zero, temperature corrections begin to be made as the output of integrator 44 is multiplied by T and applied to summing amplifier 52 and thence to oscillator 10 ET control voltage. As integrator 44 approaches a steady state value approximating U, the temperature induced perturbations of the hi-pass frequency-locked voltage at the multiplier 42 are quenched and the correlation approaches zero. Similarly, fractional frequency error applied to integrators 18 and 51 are no longer affected by temperature fluctuations. The output of integrator 44 will be stable at U, the temperature coefficient of the voltage controlled oscillator 10.

Upon loss or absence of the reference frequency 14, switch 50B which is coordinated with switch 50A is set to ground, freezing the output of integrator 44 at its then current value.

The variable correction factors B, U are measured in the control loops which are weighted by averaging time parameters K, L, respectively. The measured values of B, U are stored and the weighting factors K, L are adjusted according to the variance of the most recent parameter measurement from the stored average. The weighting factors K, L associated with the integrators 18, 44 establish the averaging time of successive measurements, with the result that each control loop is independently adaptable. Several methods for computing the value of weighting factors K and L may be used. In a preferred method of the invention, values of the weighting factors $K_j$, $L_j$ for successive measurements are computed as follows:

$$K_j = K_i(B_j/B_i)$$

$$L_j = L_i(U_j/U_i)$$

where:
- $K_i$, $K_j$ are first and second weighting factors corresponding with first and second successive measurements;
- $B_i$, $B_j$ are first and second values of the predictable parameter B;
- $L_i$, $K_j$ are first and second successive weighting factors; and,
- $U_i$, $U_j$ are first and second successive values of the predictable parameter U.

Alternatively, the weighting factors may be adjusted using a simpler algorithm, for example:

$$L_j = GL_i + (1-G)L_f$$

where:
- $L_i$, $L_j$ are the first and second weighting factors corresponding with the first and second successive measurements;

$L_f$ is the desired final value of the weighting factor; and,

G is a constant.

In this approach, the value of L is chosen for the initial $L_o$ and final $L_f$ desired values. The value of L is adjusted after each successive measurement has been completed, exponentially approaching $L_f$. Since the temperature response of an oscillator is controlled by heat transfer through the oven walls and other parameters not subject to change (although they may vary widely from unit to unit), this approach often provides adequate control of the temperature compensation loop in a benign environment.

The values of the weighting factors K, L are adjusted after each successive measurement has been completed. Because the weighting factors K, L establish the averaging time of the respective loops, the adjusted values of B, U depart from their initial arbitrary settings to follow closely and converge to the actual values of the parameters B, U for large numbers of adaptive iterations.

Referring again to FIG. 5, in the absence of the primary reference signal $F_o$, the correction factors A, Bt and UT are added together and input as a correction voltage ET to the voltage controlled resonator 10, thereby correcting the fractional frequency offset and removing long-term aging drift and ambient heat transfer Q induced frequency fluctuations. The disciplined frequency standard will thereafter provide a local reference frequency F which agrees closely with the primary reference frequency $F_o$, even though the primary reference is no longer available. While it remains necessary to periodically synchronize and calibrate the voltage controlled crystal oscillator 10, it will operate with considerably improved stability in the free-running mode in the absence of the primary frequency standard.

Although the invention has been described with reference to a specific embodiment, and with reference to a specific voltage control crystal resonator application, the foregoing description is not intended to be construed in a limiting sense. Various modifications of the disclosed embodiment as well as alternative applications of the invention will be suggested to persons skilled in the art by the foregoing specification and illustrations. For example, virtually all resonators, including atomic resonators, have some temperature dependency and operation of such devices will be improved by the present invention. For example, a Rubidium frequency source has a long-term aging characteristic and is housed in an oven and has a temperature dependency. A cesium atomic standard also has a temperature dependency and could be improved by an adaptive control loop as disclosed herein. It is therefore contemplated that the appended claims will cover any such modifications, embodiments or applications that fall within the true scope of the invention.

What is claimed is:

1. In a disciplined frequency standard of the type having a variable frequency oscillator including a temperature dependent crystal resonator and an input circuit for driving the frequency of oscillation of the resonator in proportion to the magnitude of an electronic tuning signal applied to said input, and wherein said resonator is enclosed within an oven having an electrical heater for generating heat within the oven in response to the flow of electrical current through the heater, the improvement comprising a current sensing element coupled to said oven heater for producing an analog signal T proportional to the magnitude of current flowing through said sensing element, means for generating a parameter U proportional to the rate of change of frequency of the resonator with respect to the rate of change of temperature within said oven, and means for inputting an electronic tuning signal which includes as one of its components the product UT to the input circuit of said resonator circuit.

2. In a disciplined frequency standard as defined in claim 1, said parameter generating means comprising:
a difference frequency detector for generating a difference signal proportional to the difference between the output frequency of the variable frequency oscillator and the frequency of a primary reference;
means coupled to said difference frequency detector for generating a first signal proportional to the time rate of change of the frequency F of said variable frequency oscillator;
means coupled to said variable frequency oscillator for generating a second signal proportional to the time rate of change of the temperature T of said crystal resonator;
means responsively coupled to said first and second proportional signals for generating the quotient dF/dT;
means coupled to said variable frequency oscillator for generating an analog signal proportional to the temperature T of said crystal resonator; and,
a multiplier having first and second inputs connected to receive the signals dF/dT and T, and generating the product T=dF/dT.

3. In a disciplined frequency standard as defined in claim 2, wherein said means for generating the time differential of frequency F and the time differential of temperature T is a high pass filter.

4. A closed loop temperature compensated frequency reference comprising, in combination:
a controllable oscillator for generating a first frequency;
means for inputting a second frequency from a reference oscillator;
a difference frequency detector coupled to the output of the controllable oscillator and the reference oscillator for generating a difference signal proportional to the difference of the first frequency relative to the second frequency; and,
means for generating an electronic tuning signal which is a function of said difference signal and the rate of heat transfer between the controllable oscillator and its surrounding environment, said electronic tuning signal being applied to the input of said controllable oscillator.

5. A method for stabilizing the output frequency of a disciplined frequency standard with respect to a predictable parameter, said disciplined frequency standard having a variable frequency oscillator including a crystal resonator which is dependent upon said predictable parameter, and having an input circuit for driving the frequency of oscillation of the resonator in proportion to the magnitude of an electronic tuning signal applied to its input, comprising the steps:
successively measuring the magnitude of the predictable parameter while said resonator is coupled in frequency lock relation with the frequency of a primary standard;
multiplying the measured value of the predictable parameter by a weighting factor;

storing the measured values of the predictable parameter and comparing the most recent parameter measurement with a previous measured value of said parameter; and, increasing or decreasing the weighting factor in proportion to the variance of the most recent measurement of the predictable parameter relative to said previous measured value.

6. A method for stabilizing the output frequency of a disciplined frequency standard with respect to a predictable parameter as defined in claim 5, wherein the adjusted values of a weighting factor H for successive measurements (i, j) of a predictable parameter M are computed according to the following relation:

$$H_j = H_i(M_j/M_i)$$

where $H_i$, $H_j$ are first and second weighting factors corresponding with first and second successive measurements and $M_i$, $M_j$ are first and second values of a predictable parameter M.

7. A method as defined in claim 5 wherein said predictable parameter is proportional to the fractional frequency drift of said crystal resonator as a function of elapsed time.

8. A method as defined in claim 5 wherein said predictable parameter is proportional to the incremental change of resonator frequency as a function of incremental change of temperature experienced by said crystal resonator.

9. A method for stabilizing the output frequency of a disciplined frequency standard with respect to a predictable parameter as defined in claim 5, wherein the adjusted values of a weighting factor H for successive measurements (i, j) of a predictable parameter are computed according to the following relation:

$$H_j = GH_i + (1-G)L_f$$

where:

$H_i$, $H_j$ are the first and second weighting factors corresponding with the first and second successive measurements;

$L_f$ is the desired final value of the weighting factor; and,

G is a constant.

* * * * *

UNITED STATES PATENT AND TRADEMARK OFFICE
CERTIFICATE OF CORRECTION

PATENT NO. : 4,839,613
DATED : 06/13/89
INVENTOR(S) : James D. Echols, et al.

It is certified that error appears in the above-identified patent and that said Letters Patent is hereby corrected as shown below:

<u>In the Abstract</u>

Line 20, "parameters" should be -- parameter --.

<u>In the Specification</u>

Column 1, line 55, "freerunning" should be -- free-running --.

Column 3, line 16, "deep" should be -- drop --.

Column 3, line 27, "frictional" should be -- fractional --.

<u>In the Claims</u>

Column 8, line 32, "T = dF/dT" should be -- T x dF/dT --.

Signed and Sealed this

Thirteenth Day of March, 1990

Attest:

JEFFREY M. SAMUELS

Attesting Officer     Acting Commissioner of Patents and Trademarks